United States Patent [19]

Oda

[11] Patent Number: 4,891,603

[45] Date of Patent: Jan. 2, 1990

[54] LOGARITHMIC AMPLIFIER

[75] Inventor: Minoru Oda, Hyogo, Japan

[73] Assignee: Mitsubishi Denki Kabushiki Kaisha, Tokyo, Japan

[21] Appl. No.: 279,773

[22] Filed: Dec. 5, 1988

[30] Foreign Application Priority Data

Jun. 20, 1988 [JP] Japan ................................ 63-149984

[51] Int. Cl.[4] ........................... G06G 7/24; H03F 1/30

[52] U.S. Cl. .................................... 330/110; 330/143; 307/492; 328/145

[58] Field of Search ........................ 307/490, 491, 492; 328/145; 330/110, 143, 149, 289

[56] References Cited

U.S. PATENT DOCUMENTS 3,584,232 6/1971 Wallace, Jr. ......................... 307/492
3,700,918 10/1972 Kawashima ..................... 307/492 X

FOREIGN PATENT DOCUMENTS 1437565 5/1976 United Kingdom .
1453709 10/1976 United Kingdom .

OTHER PUBLICATIONS

Burr-Brown Products Data Book 1988, (Japan), pp. 4-18, 4-22.

*Primary Examiner*—Steven Mottola
*Attorney, Agent, or Firm*—Bernard, Rothwell & Brown

[57] ABSTRACT

A logarithmic amplifier which obtains accurate logarithmic output voltage and expands maximum current value and which realizes accurate logarithmic conversion by eliminating logarithmic conversion error voltage resulting from internal resistance of logarithmic conversion element using a voltage appearing when a forward current of logarithmic conversion element is applied to a resistor.

8 Claims, 2 Drawing Sheets

LOGARITHMIC AMPLIFIER

BACKGROUND OF THE INVENTION

1. Field of the Invention

The present invention relates to a logarithmic amplifier which generates an output voltage proportional to a logarithmic value of input current value and, for example, is used in radiation measuring circuits.

2. Description of the Prior Art

FIG. 1 is a circuit indicating an example of the conventional logarithmic amplifier. In this figure, 1 is an input terminal, 2 is an operatin amplifier, and 3 is a transistor used as a logarithmic conversion feedback element of operational amplifier 2. The collector of transistor 3 is connected to an inversion input terminal of operational amplifer 2 and the emitter is connected to an output terminal 4 of the operational amplifier 2. 31, 32 are respectively internal resistances provided between the emitter-base junction of transistor 3 and external electrodes.

Operations are explained hereunder.

The relationship between collector current $I_c$ and base-emitter voltage V of the transistor 3 is expressed by the following equation.

$$I_c = I_s(e^{qv/kT} - 1) \quad (1)$$

Here, $I_s$: backward saturation current q: electron charge k: Boltzman's constant T: absolute temperature The equation (1) can be transformed as follows.

$$V = \frac{kT}{q} \ln \frac{I_c + I_s}{I_s} \quad (2)$$

Here, since $I_s$ is much smaller than $I_c$, it can be omitted and thereby the equation (2) can be simplified as follows.

$$V \approx \frac{kT}{q} \ln \frac{I_c}{I_s} \quad (3)$$

When an input current is applied to the input terminal 1 in the circuit of FIG. 1, the input current becomes a collector current $I_c$ of transistor 3 by the effect of operational amplifier 2 and a logarithmic voltage V indicated by the equation (3) is generated at the emitter of transistor 3. This voltage can be detected from the output terminal 4.

Therefore, a voltage proportional to a logarithmic input current value can be obtained at the output terminal 4 by supplying an input current to the input terminal 1 of the circuit of FIG. 1.

Since the conventional logarithmic amplifier is constituted as explained above, a logarithmic voltage including a voltage drop across internal resistances 31, 32 of the emitter electrode and base electrode of the transistor 3 is obtained. Namely, the equation (1) is applied to the ideal transistor and a voltage V of the equation (3) of actual transistor 3 is not an accurate logarithmic voltage value. When the internal resistances 31, 32 are $R_{31}$, $R_{32}$, emitter current is $I_e$, and base current is $I_b$, a logarithmic voltage value $V_r$ including the effect of internal resistances can be expressed by the following equation.

$$V_r = \frac{kT}{q} \ln \frac{I_c}{I_s} + (R_{31}I_e + R_{32}I_b) \quad (4)$$

The second term of equation (4) is an error for logarithmic characteristic. A larger input current results in a larger error, raising a problem that the maximum value of input current is limited.

SUMMARY OF THE INVENTION

The present invention has been proposed to eliminate such problems and it is an object of the present invention to obtain a logarithmic amplifier which has expanded the range of input current by eliminating the logarithmic conversion error voltage resulting from the internal resistance of the logarithmic conversion element and executing an accurate logarithmic conversion.

The logarithmic amplifier of the present invention provides an error correcting means which causes a resistor provided to the output terminal of the operational amplifier to generate an error equivalent voltage of the same value as the logarithmic conversion error voltage generated by the internal resistance of the logarithmic conversion element and subtracts such error equivalent voltage from the logarithmic conversion output voltage of the logarithmic conversion element.

DETAILED DESCRIPTION OF THE PREFERRED EMBODIMENTS

Figure 1:
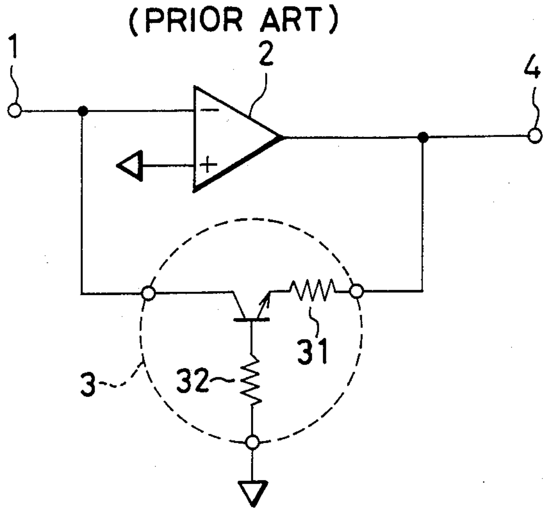
FIG.1 (PRIOR ART)
FIG. 1 is a circuit diagram of a conventional logarithmic amplifier.
Figure 2:
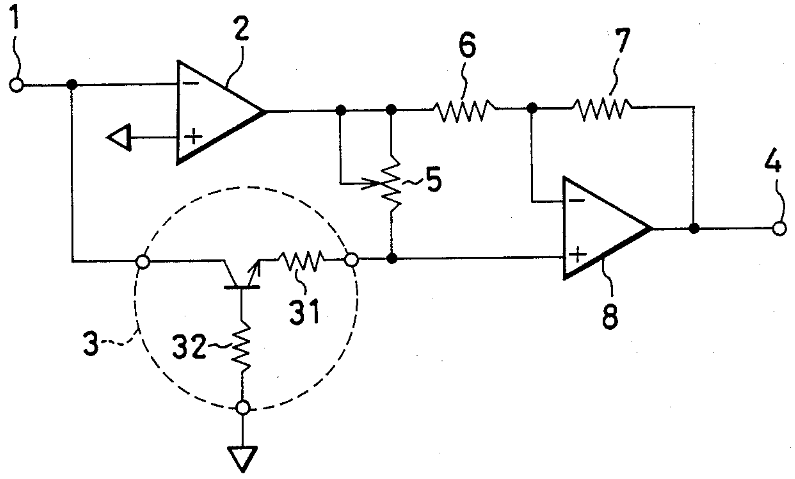
FIG. 2 is a circuit diagram indicating constitution of a logarithmic amplifier in an embodiment of the present invention.

An embodiment of the present invention will be explained with reference to the accompanying drawings. FIG. 2 is a circuit diagram indicating an embodiment of the present invention. In FIG. 2, 5 is variable resistor connected in series to the transistor 3 and a resistance value $R_5$ of this variable resistor 5 is set by the following equation.

$$R_5 = R_{31} + \frac{R_{32}}{h_{FE} + 1}$$

6 is an input resistor, 7 is 1 feedback resistor and 8 is an operational amplifier as an error correcting means. An inversion amplifier having a gain of 1 can be constituted by connecting an input resistor 6 to the inversion input terminal of the operational amplifier 8, also connecting a feedback resistor 7 between such inversion input terminal and the output terminal of the operational amplifier 8 and setting the resistance value of input resistor 6 equal to that of the feedback resistor 7.

Operations are explained hereunder. When an input current is applied to the input terminal 1, a voltage proportional to a logarithmic value of the input current value is obtained at the emitter of transistor 3 but this voltage includes an error corresponding to the second term of the equation (4). Since an emitter current of transistor 3 flows through the variable resistor 5, a voltage proportional to the second term of the equation (4) appears. Here, the second term of the equation (4) can be transformed as follows.

$$R_{31}I_e + R_{32}I_b = R_{31}I_e + R_{32}\frac{I_e}{h_{FE}+1} = \left(R_{31} + \frac{R_{32}}{h_{FE}+1}\right)I_e \quad (5)$$

Therefore, a resistance value of variable resistor 5 is defined as $R_5$ and the resistance value $R_5$ of variable resistor 5 can be expressed as follows.

$$R_5 = R_{31} + \frac{R_{32}}{h_{FE}+1} \quad (6)$$

With the adjustment according to the equation (6), a logarithmic conversion error voltage resulting from internal resistances 31, 32 of transistor 3 which is equal to the second term of the equation (4) can be reproduced at both ends of the variable resistor 5.

Moreover, since an input resistor 6, a feedback resistor 7 and an operational amplifier 8 constitute an inversion amplifier with a gain of 1, a voltage which is equal to that obtained by subtracting the logarithmic conversion error voltage appearing at the variable resistor 5 from the emitter voltage of transistor 3 appears at the output terminal 4. As a result, the voltage appearing at the output terminal 4 becomes equal to a value obtained by eliminating the error element of the second term from the voltage value of the equation (4) and the voltage thus obtained matches the voltage value of equation (3). Namely, an accurate logarithmic output voltage not including the logarithmic conversion error voltage resulting from the internal resistances 31, 32 appears at the output terminal 4 by the subtraction explained above. Thereby, the maximum value of input current which realizes accurate logarithmic conversion can also be expanded. Expansion of the upper limit of input current by this methods depends on the accuracy for satisfying the equation (6) and thereby the maximum input current can generally be expanded by about ten to twenty times compared to that of the conventional logarithmic amplifier.

In above embodiment, a variable resistor 5 is provided as the adjusting element and logarithmic conversion error voltage resulting from internal resistances 31, 32 of transistor 3 is corrected by satisfying the relationship of the equation (6), but such correction can be made also by using either the input resistor 6 or feedback resistor 7 as the variable resistor as the adjusting element for such correction.

Figure 3:
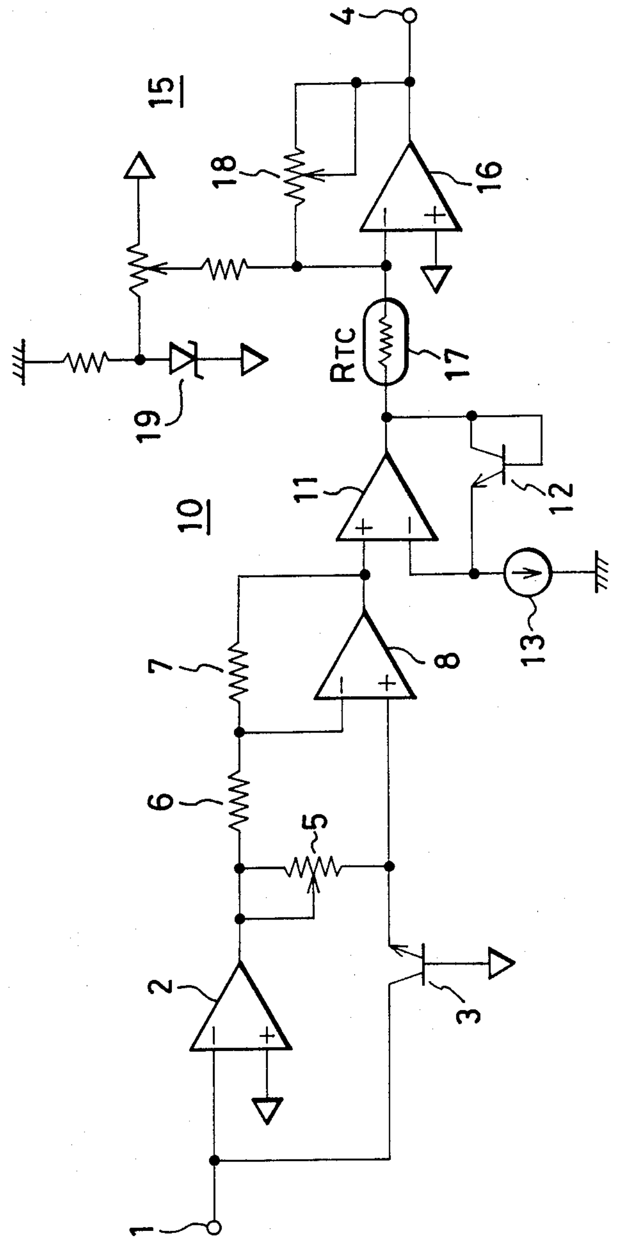
FIG. 3 is a circuit diagram indicating another embodiment of the present invention.

FIG. 3 is a circuit diagram indicating another embodiment of the present invention wherein temperature compensation circuits 10, 15 are added to the embodiment of FIG. 2. Since the logarithmic amplifier utilizing the current voltage characteristic of the semiconductor junction has a temperature characteristic resulting from the temperature characteristic of the semiconductor junction, temperature compensation is necessary in case high accuracy is required. Namely, the temperature compensation circuit 10 is constituted by a buffer amplifier 11, a transistor 12 and a constant current source 13, while the temperature compensation circuit 15 is constituted by an operation amplifier 16, a temperature compensation resistor 17, a variable resistor 18 and a voltage regulation diode 19. With such constitution, the temperature compensation circuit 10 compensates for level change by temperature while the temperature compensation circuit 15 provides a temperature compensation resistor 17 to compensate for change of gain by temperature.

As explained above, according to the present invention, the logarithmic amplifier is constitute by adding a resistor to which a forward current flowing into the logarithmic element is applied to result in a voltage almost equal to logarithmic conversion error voltage resulting from internal resistance of the logarithmic conversion element and an operational amplifier which subtracts a voltage of such resistor from the logarithmic conversion error voltage. Thereby, the present invention provides the effect that accuracy of logarithmic conversion can be improved and the upper limit of input current realizing accurate logarithmic conversion can also be expanded.

What is claimed is:

1. A logarithmic amplifier for generating an output voltage proportional to a logarithmic value of an input current, comprising:

an operational amplifier including inversion and non-inversion input terminals and an output terminal, said input current being applied to said inversion input terminal;

a logarithmic conversion element connected between said inversion input terminal and said output terminal, said conversion element having a logarithmic current to voltage characteristic;

resistance means coupled to said output terminal for developing a voltage thereacross substantially equal to a logarithmic conversion error voltage produced by an internal resistance of said logarithmic conversion element; and error compensating means for subtracting the voltage developed by said resistance means from an output of said logarithmic conversion element to generate said output voltage.

2. A logarithmic amplifier according to claim 1, wherein said resistance means is a variable resistor which varies resistance values and said error compensating means comprises a second operational amplifier, and input resistor connected to an inversion input terminal of the second operational amplifier and a feedback resistor connected between an output terminal and said inversion input terminal of the second operational amplifier and having a resistance value the same as that of said input resistor constituting an inverting amplifier with a gain of 1.

3. A logarithmic amplifier according to claim 1, wherein said error compensating means is constituted by an inversion amplifier consisting of a second operational amplifier, a variable input resistor which is connected to an inversion input terminal of the second operational amplifier to vary the resistance values and a feedback resistor connected between an output terminal and the inversion input terminal of the second operational amplifier.

4. A logarithmic amplifier according to claim 1, wherein said error compensating means is constituted by an inversion amplifier consisting of a second operational amplifier, an input resistor connected to an inversion input terminal of the second operational amplifier and a variable feedback resistor which is connected between an output terminal and said inversion input terminal of the second operational amplifier to vary the resistance value.

5. A logarithmic amplifier for generating an output voltage proportional to a logarithmic value of an input current, comprising:

an operational amplifier including inversion and non-inversion input terminals and an output terminal, said input current being applied to said inversion input terminal;

a logarithmic conversion element connected between said inversion input terminal and said output terminal, said conversion element having a logarithmic current to voltage characteristic;

resistance means coupled to said output terminal for developing a voltage thereacross substantially equal to a logarithmic conversion error voltage produced by an internal resistance of said logarithmic conversion element;

error compensating means for subtracting the voltage developed by said resistance means from an output of said logarithmic conversion element to generate said output voltage;

a first temperature compensating circuit coupled to an output terminal of said error compensating means to compensate for temperature-caused change in output level of said logarithmic conversion element; and a second temperaturecompensating circuit coupled to an output terminal of said first temperature compensating circuit to compensate for temperature-caused change in gain of said logarithmic conversion element.

6. A logarithmic amplifier according to claim 5 wherein the first temperature compensating circuit is constituted by a buffer amplifier, a constant current source connected to an inversion input terminal of said buffer amplifier and a transistor connected between an output terminal and said inversion input terminal of said buffer amplifier.

7. A logarithmic amplifier according to claim 5 wherein the second temperature compensating circuit is constituted by a third operational amplifier, a temperature compensating resistor connected between an inversion input terminal of the third operational amplifier and said output terminal of the first temperature compensating circuit, a voltage regulation diode connected to the inversion input terminal of the third operational amplifier through a resistor and a variable resistor connected between an output terminal and inversion input terminal of the third operational amplifier.

8. A logarithmic amplifier according to claim 6 wherein the second temperature compensating circuit is constituted by a third operational amplifier, a temperature compensating resistor connected between an inversion input terminal of the third operational amplifier and said output terminal of the first temperature compensating circuit, a voltage regulation diode connected to the inversion input terminal of the third operational amplifier through a resistor and a variable resistor connected between an output terminal and inversion input terminal of the third operational amplifier.

* * * * *

UNITED STATES PATENT AND TRADEMARK OFFICE

CERTIFICATE OF CORRECTION

PATENT NO. : 4,891,603

DATED : January 2, 1990

INVENTOR(S) : MINORU ODA

It is certified that error appears in the above-identified patent and that said Letters Patent is hereby corrected as shown below:

Col. 1, line 13, "operatin" should be --operational--;
Col. 1, line 17, "amplifer" should be --amplifier--;
Col. 1, line 28, "$I_c=I_s(_eqv/kT_{-1})$" should be --$I_c=I_s(_eqV/kT_{-1})$--.

Col. 3, line 42, "methods" should be --method--;
Col. 3, line 45, before "compared" insert --as--.

Col. 4, line 8, "constitute" should be --constituted--.

Col. 5, line 30, "temperaturecompensating" should be --temperature compensating--.

Signed and Sealed this

Ninth Day of July, 1991

Attest:

HARRY F. MANBECK, JR.

*Attesting Officer*

*Commissioner of Patents and Trademarks*